United States Patent [19]
Wojewnik

[11] Patent Number: 6,032,357
[45] Date of Patent: Mar. 7, 2000

[54] METHOD OF FABRICATING A PRINTED CIRCUIT

[75] Inventor: Albert Wojewnik, Royal Oak, Mich.

[73] Assignee: Lear Automotive Dearborn, Inc., Southfield, Mich.

[21] Appl. No.: 09/098,155

[22] Filed: Jun. 16, 1998

[51] Int. Cl.[7] .................................................. H05K 3/02
[52] U.S. Cl. .............................. 29/846; 29/830; 156/219; 156/220
[58] Field of Search .............................. 29/825, 830, 846, 29/596; 156/219, 220

[56] References Cited

U.S. PATENT DOCUMENTS

| | | | |
|---|---|---|---|
| 3,427,715 | 2/1969 | Mika | 29/846 X |
| 4,810,917 | 3/1989 | Kumar et al. | 29/596 X |
| 4,816,836 | 3/1989 | Lalezari | 29/846 X |
| 4,944,087 | 7/1990 | Landi | 29/846 X |
| 5,220,488 | 6/1993 | Denes | 29/846 X |

OTHER PUBLICATIONS

Injection Molded thermoplastic Printed Circuit Boards by J. Travis et al, paper in 1st Intr SAMPE Electronics Conf. vol. 1, pp 668–680 (1987).

Molded circuit interconnects perform to specification by D.C. Friseh paper in Printed Circuit Design V6 n 11 Nov. 1989 pp 78–82.

"Single–and multilayer molded circuits using image decals in the molding Process" by Frank Wood et al paper in Electronic Manufacturing vol. 36 n 7 Jul. 1990 pp 24–27.

*Primary Examiner*—Carl J. Arbes
*Attorney, Agent, or Firm*—Brooks & Kushman P.C.

[57] ABSTRACT

The present invention comprises a printed circuit having a three-dimensional surface capable of conforming to a contoured surface of a vehicle trim panel. Printed circuit comprises a plurality of electrical conductors and connectors secured to a polymeric substrate. A convoluted region of the printed circuit permits formation of the three-dimensional surface in the printed circuit. The present invention further comprises a method a producing three-dimensional surface and the printed circuit by either thermoforming the printed circuit or mechanically stretching the printed circuit to produce the three-dimensional surface.

8 Claims, 4 Drawing Sheets

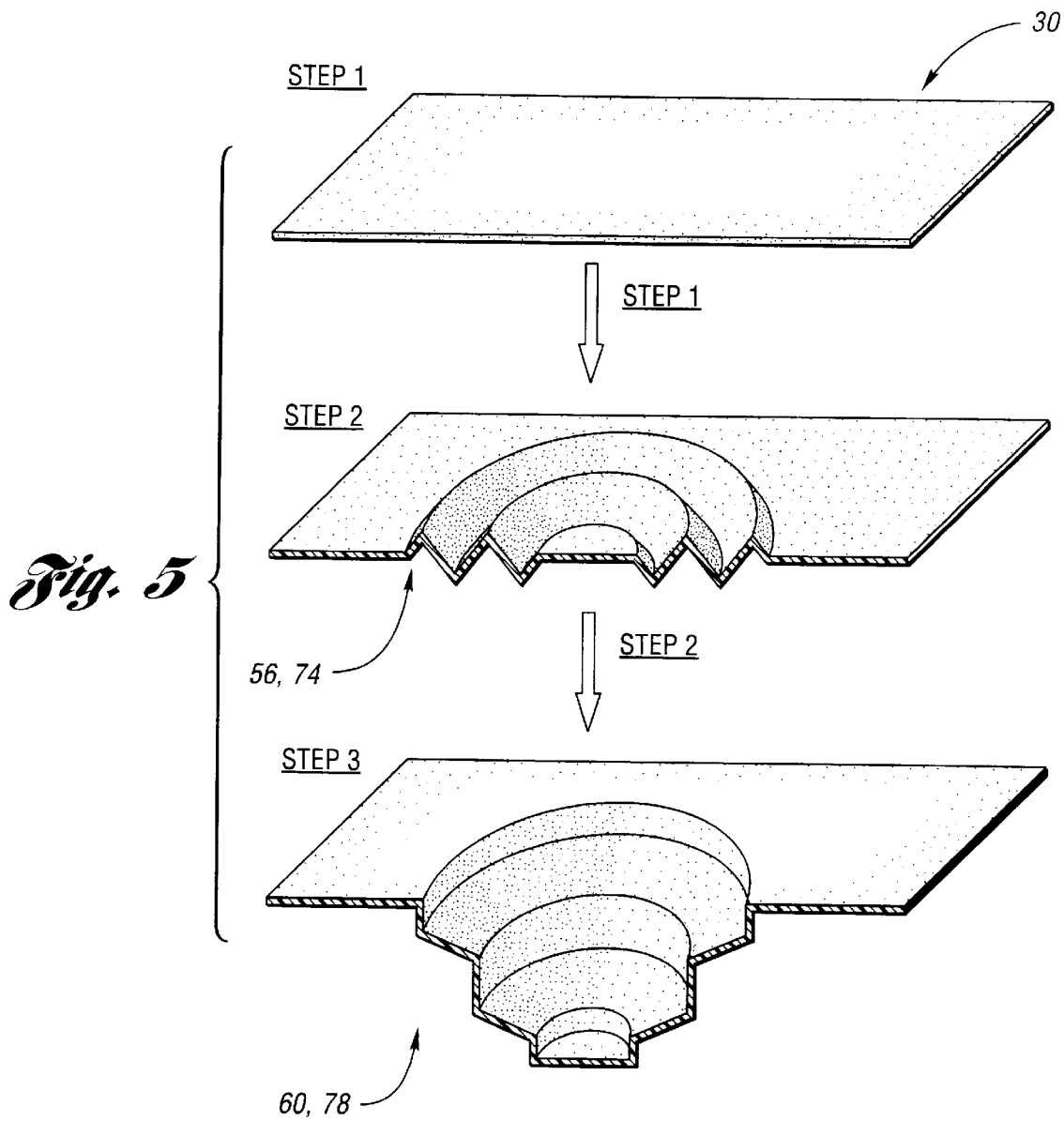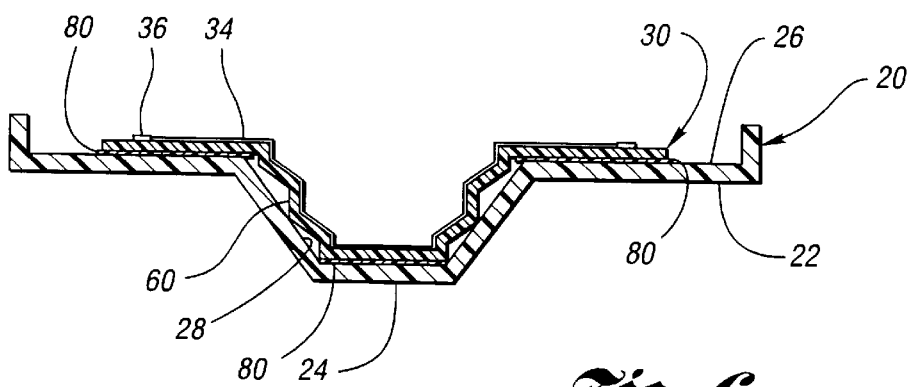

METHOD OF FABRICATING A PRINTED CIRCUIT

BACKGROUND OF THE INVENTION

This invention relates generally to printed circuits and, more particularly, to a printed circuit designed to conform to a contoured surface of a vehicle trim panel and a method of forming the printed circuit.

Vehicles typically include a number of trim panels bounded to different interior surfaces. One common type of trim panel is a door trim panel mounted to the interior surface of a door assembly. The trim panel conceals the interior surface of the door. The door trim panel is conventionally formed of a rigid panel, such as molten plastic or pressed hardboard, covered with a flexible decorative trim material such as cloth, vinyl, leather, and/or carpeting. The door trim panel is attached to the door by suitable fasteners.

The door trim panel also often supports a number of electrical components. These components may include lights, window controls, rearview mirror controls, seat adjustment controls, and audio speakers. Each of these electrical components requires an individual wiring connector and power supply lead wires. The power supply lead wires for all the electrical components must be either affixed to an inner surface of the trim panel or to the door to eliminate movement of the wires during operating conditions.

It has been proposed that, the power supply lead wires be secured to a substrate that is subsequently secured to the inner surface of the trim panel. The proposed substrate has been a relatively flat flexible material.

One difficulty encountered in securing the substrate to the trim panel is that the inner surface of the trim panel often includes a number of contoured surfaces. The typical flexible relatively flat substrate is unable to closely conform to these contoured surfaces of the trim panel, thus there is a poor fit between the substrate and the trim panel. Prior solutions to this problem have involved labor intensive fitting of the substrate to a trim panel.

Thus, it is desirable to provide a method for manufacturing a relatively flat flexible substrate that supports a plurality of electrical connections and which can be conformed to a contoured surface in a trim panel.

SUMMARY OF THE INVENTION

In general terms, this invention provides a flat flexible printed circuit having selected three-dimensional surfaces that permit it to conform to a contoured surface of a trim panel and a method for manufacturing the same.

The present invention comprises a plurality of electrical conductors secured to a relatively flat polymeric substrate. The printed circuit includes a convoluted region formed from a plurality of ridges. Manipulation of the convoluted region permits it to be displaced from a plane of the printed circuit, thus forming a relatively flat printed circuit having a three-dimensional surface. In a preferred embodiment of the present invention, the printed circuit is secured to a vehicle trim panel having at least one contoured surface, with the three-dimensional surface oriented opposite and substantially conforming to the shape of the contoured surface.

A method according to the present invention comprises the steps of creating a printed circuit having a plurality of electrical conductors and electrical connectors mounted to a relatively flat polymeric substrate. At least one convoluted region is created in the printed circuit. The convoluted region is moved out of the plane of the printed circuit, thereby creating a printed circuit having a three-dimensional surface. In a preferred embodiment, the three-dimensional surface is oriented opposite a contoured surface of a vehicle trim panel and the printed circuit is secured to the trim panel.

These and other features and advantages of this invention will become more apparent to those skilled in the art from the following detailed description of the presently preferred embodiment. The drawings that accompany the detailed description can be described as follows.

BRIEF DESCRIPTION OF THE DRAWINGS

FIG. 5 shows the steps in forming the three-dimensional surface; and

FIG. 6 is a cross-sectional view of a printed circuit of the present invention secured to a vehicle trim panel.

DETAILED DESCRIPTION OF THE PREFERRED EMBODIMENT

Figure 1A:
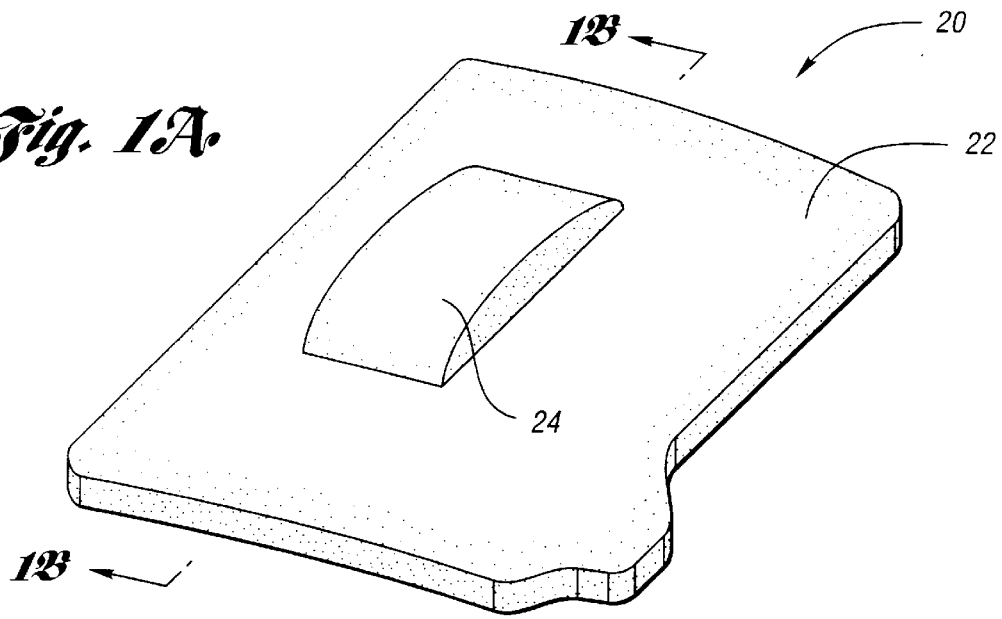
FIG. 1A is a perspective view of a vehicle trim panel.
Figure 1B:
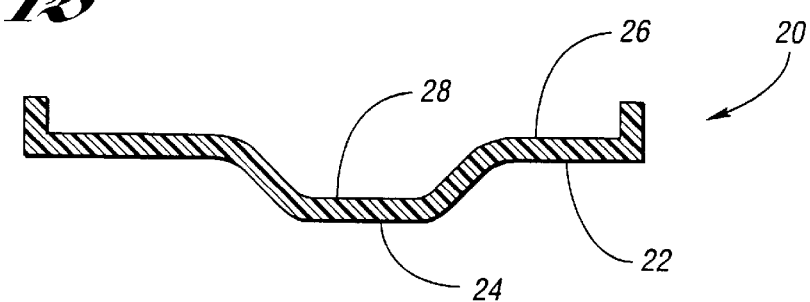
FIG. 1B is a cross-sectional view along line B—B of FIG. 1A.

A vehicle trim panel is generally indicated at 20 in FIG. 1A. Trim panel 20 includes an outer surface 22 and a contoured portion 24. FIG. 1B is a cross-sectional view of trim panel 20 alone line B—B of FIG. 1A. Trim panel 20 also includes an inner surface 26 having a contoured surface 28. As will be understood by one of ordinary skill in the art the shape of contoured surface 28 need not be the same as contoured portion 24. In fact, trim panel 20 may have a relatively flat outer surface 22 and a plurality of contoured surfaces 28 on its inner surface 26.

Figure 2:
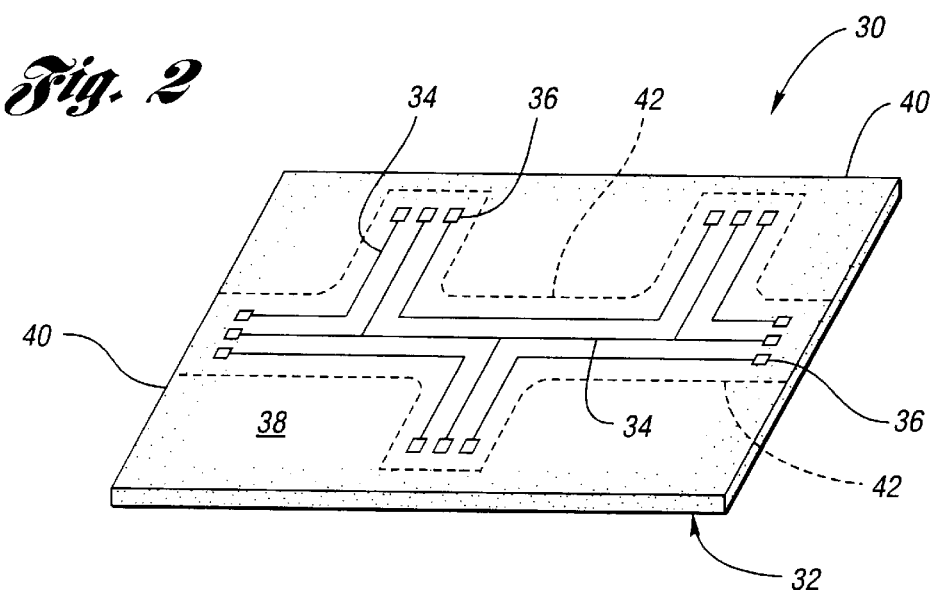
FIG. 2 is a perspective top view of a printed circuit designed according to the present invention.

A flexible printed circuit is generally indicated at 30 in FIG. 2. Printed circuit 30 includes a polymeric substrate 32, electrical conductors 34 and electrical connectors 36. Electrical connectors 36 are connected to electrical conductors 34. Electrical conductors 34 and electrical connectors 36 are secured to a first side 38 of polymeric substrate 32. Printed circuit 30 includes a peripheral edge 40. A series of trim lines 42 are shown in phantom in FIG. 2. Trim lines 42 represent one desirable final shape of peripheral edge 40 of printed circuit 30. As will be understood by one of ordinary skill in the art the shape of trim lines 42 could be different from those shown in FIG. 2.

Figure 3:
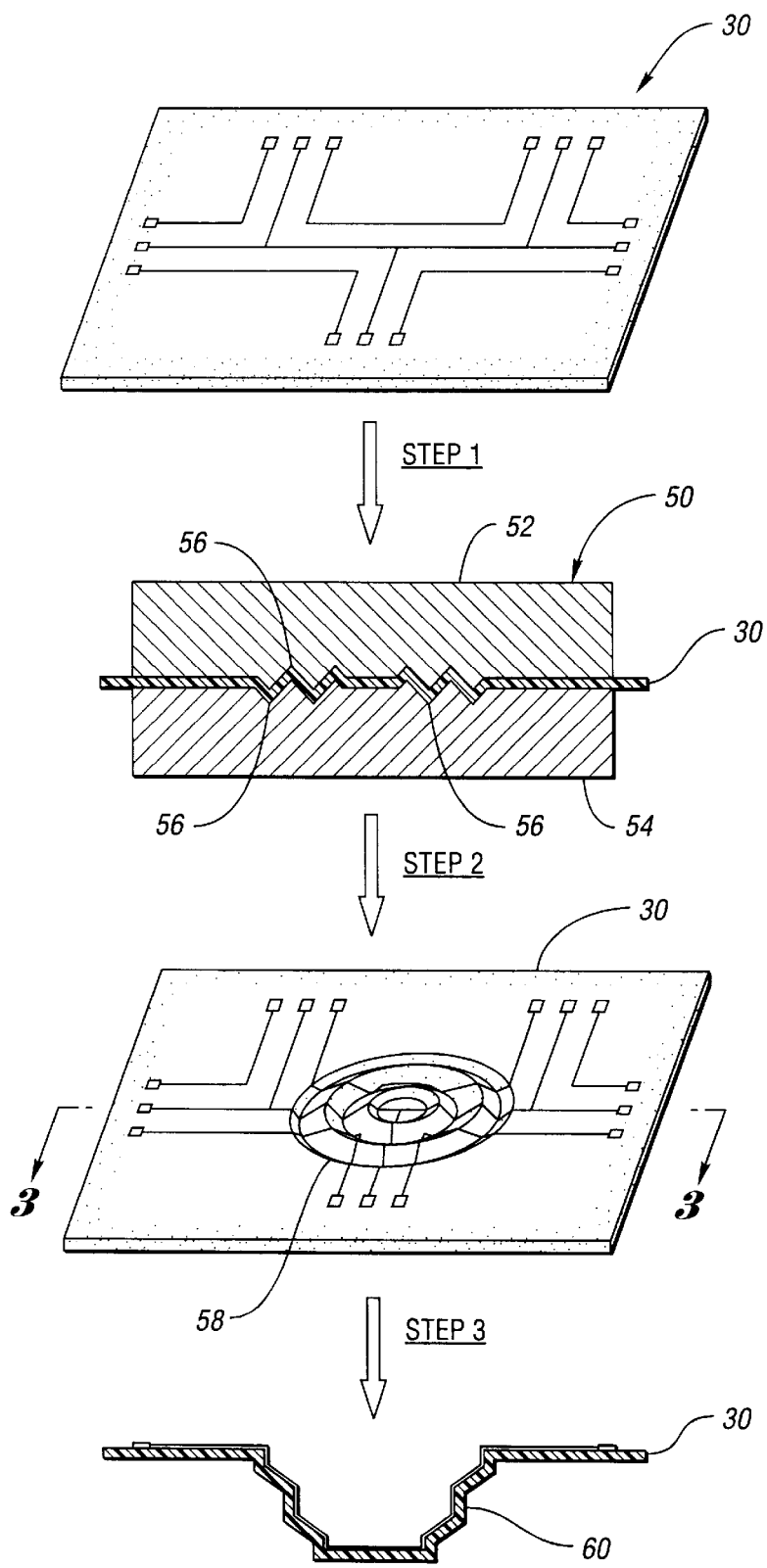
FIG. 3 is a schematic of one embodiment of the method of manufacturing the printed circuit of the present invention.

FIG. 3 is a schematic of one embodiment of the method of forming a printed circuit 30 according to the present invention. In Step 1, printed circuit 30, which includes a relatively flat polymeric substrate 32, is placed in a thermoforming mold 50. Thermoforming mold 50 includes a top half 52 and a bottom half 54. The shapes of top half 52 and bottom half 54 are complementary to each other. Top half 52 and bottom half 54 are heated and when pressed together they create a series of ridges 56 in printed circuit 30. In Step 2, printed circuit 30 is removed from thermoforming mold 50. The ridges 56 formed by thermoforming mold 50 results in a convoluted region 58 in printed circuit 30. In Step 3, convoluted region 58 is pulled away from a plane of printed circuit 30 to create a three-dimensional surface 60 in printed circuit 30. Although not clear from this figure, in this illustration the ridges 56 have a cylindrical contour (see FIG. 5).

Figure 4:
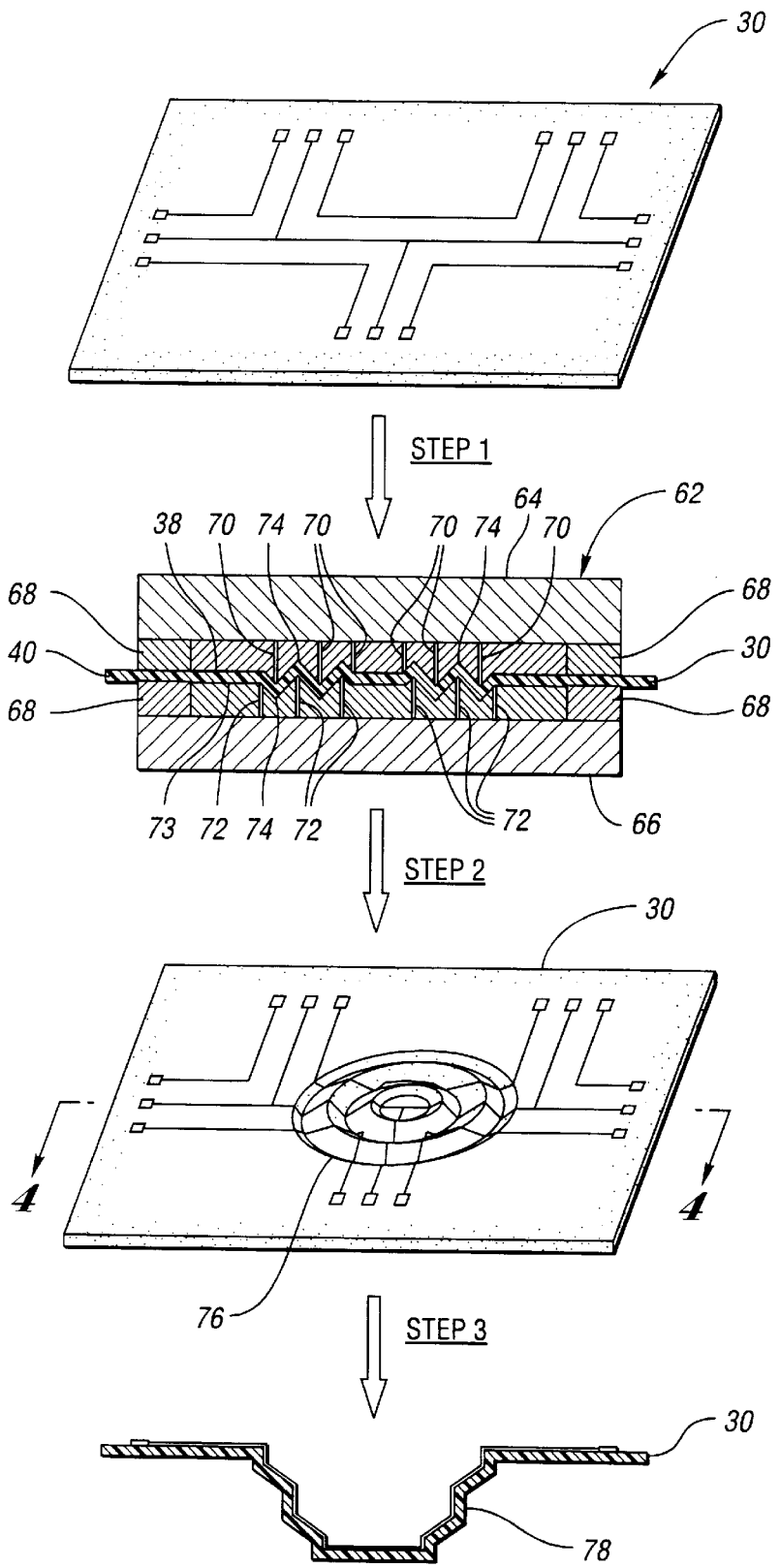
FIG. 4 is a schematic of a second embodiment of the method of the present invention.

FIG. 4 shows a schematic of another embodiment of the method of the present invention. In Step 1, printed circuit 30 is placed in a mechanical mold 62. Mechanical mold 62 includes an upper plate 64, a lower plate 66, and a plurality of clamps 68. Mechanical mold 62 further includes a plurality of first blades 70 and a plurality of second blades 72. Clamps 68 secure peripheral edge 40 of printed circuit 30. First blades 70 are arranged adjacent first side 38 of polymeric substrate 32. Second blades 72 are arranged adjacent a second side 73 of polymeric substrate 32. Preferably first blades 70 and second blades 72 are formed of steel. After clamps 68 secure peripheral edge 40, first blades 70 are moved toward second side 73 and second blades 72 are moved toward first side 38. Movement of first blades 70 and second blades 72 produce a series of ridges 74 in printed circuit 30. In Step 2, printed circuit 30 is removed from mechanical mold 62. The ridges 74 created by mechanical mold 62 results in a convoluted region 76 in printed circuit 30. In Step 3, convoluted region 76 is moved out of a plane of printed circuit 30 to create a three-dimensional surface 78. Although not clear from this figure, in this illustration the ridges 74 have a cylindrical contour (see FIG. 5).

FIG. 5 shows the three shapes of the printed circuit 30 with Step 1 being the original flat sheet. Step 2 shows the ridges 56 and 74 which are formed by molds 50 and 62, respectively. In step 3 the three-dimensional surfaces 60 and 78 are created by pulling the polymeric substrate 32 in the region of ridges 56 and 74.

FIG. 6 is a cross-sectional view of printed circuit 30 secured to inner surface 26 of trim panel 20. An adhesive 80 is used to secure printed circuit 30 to trim panel 20. Three-dimensional surface 60 or 78 is oriented over contoured surface 28 prior to securing printed circuit 30 to trim panel 20. Three-dimensional surface 60 and 78 substantially conforms to the shape of contoured surface 28. As noted above, contoured surface 28 need not conform in shape to contoured portion 24.

Polymeric substrate 32 may be comprised of a variety of materials, as is known in the art. For example, polymeric substrate 32 may comprise a thermoset or a thermoplastic polymeric material. In a preferred embodiment, polymeric substrate 32 comprises polyester.

Preferably, electrical conductors 34 comprise copper foil secured to polymeric substrate 32 by any of the methods well known in the art.

In use of mechanical molds 62, printed circuit 30 is stretched between 10–15% in convoluted region 76. Preferably, ridges 56 and 74 are relatively small, on the order of approximately 1 to 5 mm in height with a distance between adjacent ridges 56 and 74 of approximately 1 to 5 mm. As will be understood by one having ordinary skill in the art, the number of ridges 56 and 74 will be determined by the shape and depth of contoured surface 28. That is, while one convoluted region 58 and 76 is shown in these embodiments in practice there may be several, and the printed circuit 30 will be molded to have the appropriate number of convoluted regions. In addition, the cylindrical shape of the convoluted regions 58 and 76 is for illustrative purposes only, in practice the shape of a convoluted region will match the shape of contoured surface 28 on trim panel 20.

As will be understood by one of ordinary skill in the art, during the forming of convoluted region 58 or 76, the outer dimensions of printed circuit 30 are decreased and the decreased in the size of printed circuit 30 would be accounted for during the initial dimensioning of printed circuit 30. Adhesive 80 may comprise any of the adhesives well known in the art. For example, adhesive 80 may comprise a spray, a pressure sensitive adhesive, or a form adhesive.

The present invention has been described in accordance with the relevant legal standards, thus the foregoing description is exemplary rather than limiting in nature. Variations and modifications to the disclosed embodiment may become apparent to those skilled in the art and do come within the scope of this invention. Accordingly, the scope of legal protection afforded this invention can only be determined by studying the following claims.

We claim:

1. A method for fabricating a printed circuit having a three-dimensional surface, said method comprising the steps of:

a.) creating a printed circuit having a plurality of electrical conductors and electrical connectors mounted to a relatively flat polymeric substrate;

b.) creating at least one convoluted region in said printed circuit; and c.) then moving said convoluted region out of a plane of said printed circuit, thereby creating a three-dimensional surface in said printed circuit.

2. A method as recited in claim 1 further comprising the steps of:

d.) providing a vehicle trim panel having at least one contoured surface;

e.) orienting said three-dimensional surface opposite said contoured surface; and f.) securing said printed circuit to said trim panel.

3. A method as recited in claim 1 wherein said polymeric substrate comprises a thermoformable polymeric substrate and step b.) includes the step of thermoforming said printed circuit, thereby creating said convoluted region.

4. A method as recited in claim 3 wherein the step of thermoforming said printed circuit comprises forming a plurality of ridges in said printed circuit, thereby creating said convoluted region.

5. A method as recited in claim 1 wherein step b.) includes the step of mechanically stretching said printed circuit, thereby creating said convoluted region.

6. A method as recited in claim 5 wherein the step of mechanically stretching said printed circuit comprises forming a plurality of ridges in said printed circuit, thereby creating said convoluted region.

7. A method as recited in claim 5 wherein the step of mechanically stretching said printed circuit comprises mechanically stretching said printed circuit up to fifteen percent, thereby creating said convoluted region.

8. A method as recited in claim 5 wherein the step of mechanically stretching said printed circuit comprises the further steps of:

securing a peripheral edge of said printed circuit;

arranging a first blade against a first side of said polymeric substrate;

arranging a second blade against a second side of said polymeric substrate; and moving said first blade toward said second side and said second blade toward said first side, thereby mechanically stretching said printed circuit and creating said convoluted region.

* * * * *